United States Patent
Kim

(10) Patent No.: US 6,430,100 B2
(45) Date of Patent: Aug. 6, 2002

(54) REDUNDANCY CIRCUITRY FOR REPAIRING DEFECTS IN PACKAGED MEMORY HAVING REGISTERS

(75) Inventor: Tae-Yun Kim, Kyoungki-do (KR)

(73) Assignee: Hyundai Electronics Industries Co., LTD, Ichon-Shi (KR)

( * ) Notice: Subject to any disclaimer, the term of this patent is extended or adjusted under 35 U.S.C. 154(b) by 12 days.

(21) Appl. No.: 09/734,581

(22) Filed: Dec. 13, 2000

(30) Foreign Application Priority Data

Dec. 16, 1999 (KR) ........................................ 1999-58395

(51) Int. Cl.⁷ ................................................ G11C 7/00
(52) U.S. Cl. ..................... 365/225.7; 365/200
(58) Field of Search .............................. 365/200, 225.7, 365/189.12, 189.05

(56) References Cited

U.S. PATENT DOCUMENTS 5,920,515 A * 7/1999 Shalk et al. ................. 365/200

* cited by examiner

Primary Examiner—Vu A. Le
(74) Attorney, Agent, or Firm—Finnegan, Henderson, Farabow, Garrett & Dunner, L.L.P.

(57) ABSTRACT

A redundancy circuitry is used in a memory device for repairing defects in a packaged memory having registers by using antifuse. The redundancy circuitry includes: an anticell for storing data to be replaced; a temporary anticell for storing the data temporarily; a row and a column antifuse composed of antifuse and anti enable fuse corresponding to a row and column address, respectively; an antifuse controller for controlling the programming of the antifuse; a voltage supplier for supplying a voltage to program the antifuse; a row and a column comparators for comparing the programmed row and column antifuses and the external input address, respectively; an anti-controller for controlling to provide data from the anticell on a read operation and to temporarily store the external data to the temporary anticell on a write operation based on the comparison signals; a restore controller for, based on the row address on a restore operation, transferring the external data identical to the programmed fuse address to the anticell; and a channel selection memory for storing the channel address for prefetch and restore operations provided during read and write operations.

6 Claims, 3 Drawing Sheets

REDUNDANCY CIRCUITRY FOR REPAIRING DEFECTS IN PACKAGED MEMORY HAVING REGISTERS

FIELD OF THE INVENTION

This invention relates to a redundancy circuitry used in a memory for repairing defects after packaging; and, more particularly, to a redundancy circuitry, which is capable of repairing one or more defects in a packaged memory having register, thereby increasing yields and reducing fabrication costs.

DESCRIPTION OF THE PRIOR ART

There have been lots of efforts to increase operation speed of memory for a long time. One of the kinds is a memory having registers.

Memories like static dynamic random access memory SDRAM store data directly into their main memory cell and retrieve it from the main memory cell. The memories having registers, however, use registers working as a kind of buffers to temporarily store the data.

Generally, in memories having registers like a virtual channel memory (VCM) defected cells are replaced by redundancy cells in a wafer level by laser repair device before being packaged. However, there is no method known to replace the defected cells with redundancy cells after packaging because laser repair device cannot be used at a package level.

A virtual channel memory has a register called channel. Data can be written to or read from the channel instead of main memory cell and thus a high-speed operation is possible. There are typical operations such as pre-fetch, read, write and restore operations in VCM. The pre-fetch is an operation for transferring data from the memory cell to the channel, the read operation is to read data from the channel, the write operation is to write data to the channel, and the restore is an operation for transferring the data from the channel to the memory cell.

According to prior art, an active operation of a row path is occurred before a read operation of column path on pre-fetch and read operations. On the other hand, write operation of column path is occurred before active (restore) operation of row path on write and restore operations. Thus it was very difficult, if not impossible, to implement redundancy circuitry employing antifuse, thereby decreasing yields and increasing fabrication costs.

SUMMARY OF THE INVENTION

It is, therefore, an object of the present invention to provide to a redundancy circuitry, which is capable of repairing one or more defects in a packaged memory having register, thereby increasing yield and reducing fabrication costs.

In accordance with an aspect of the present invention, there is provided a redundancy circuitry used in the memory device, comprising: an anticell means for storing data to be replaced; a temporary anticell means for storing said data temporarily; a row antifuse means composed of antifuse and anti enable fuse corresponding to a row address used to program the antifuse for replacing defected cells with redundant cells in the memory; a column antifuse means composed of antifuse and anti enable fuse corresponding to a column address used to program the antifuse for replacing the defected cells with the redundant cells in the memory; an antifuse control means for controlling the programming of the antifuse in the row and column antifuse means based on said row and column addresses; a voltage supplier for supplying a voltage to program said antifuse in said row and column antifuse by said antifuse control means; a row comparator for comparing programmed said row antifuse from the row antifuse means and an external input address, thereby generating a first comparison signal; a column comparator for comparing programmed said column antifuse from the column antifuse means and the external input address, thereby generating a first comparison signal; an anti-control means for controlling to provide data from said anticell on a read operation and to temporarily store the external data to said temporary anticell on a write operation based on said first and second comparison signals from said row and column comparators; a restore control means for, based on the row address on a restore operation, transferring the external data identical to the programmed fuse address to said anticell, wherein said external data is stored temporarily in said temporary anticell by a control signal from said anti-control means and said first comparison signal from said row comparator; a channel selection memory for storing the channel address for pre-fetch and restore operations provided during read and write operations.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PERFERRED EMBODIMENTS

Figure 1A:
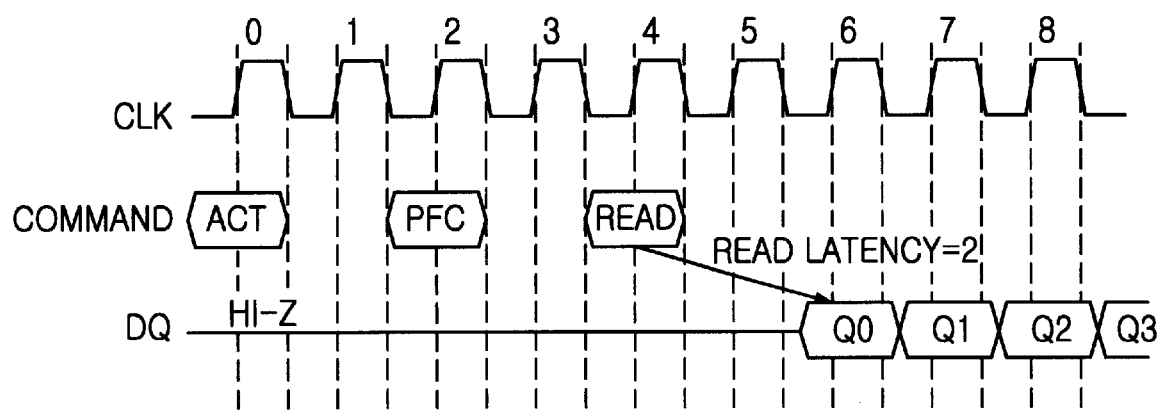
FIG. 1A illustrates a timing diagram for pre-fetch and read operations of a virtual channel memory in accordance with an embodiment of the present invention.

FIG. 1A illustrates a timing diagram for pre-fetch and read operations of a virtual channel memory in accordance with an embodiment of the present invention. As shown, command ACT is a low active command for pre-fetch operation to read data from memory cell. According to the ACT row path is activated together with row address, and data from the memory cell corresponding to the row address is provided to data lines.

PFC, a command for pre-fetch operation, transfers data from the memory cells to a channel corresponding to a column address and channel information. READ is a command to read the pre-fetched data from the channel.

Figure 1B:
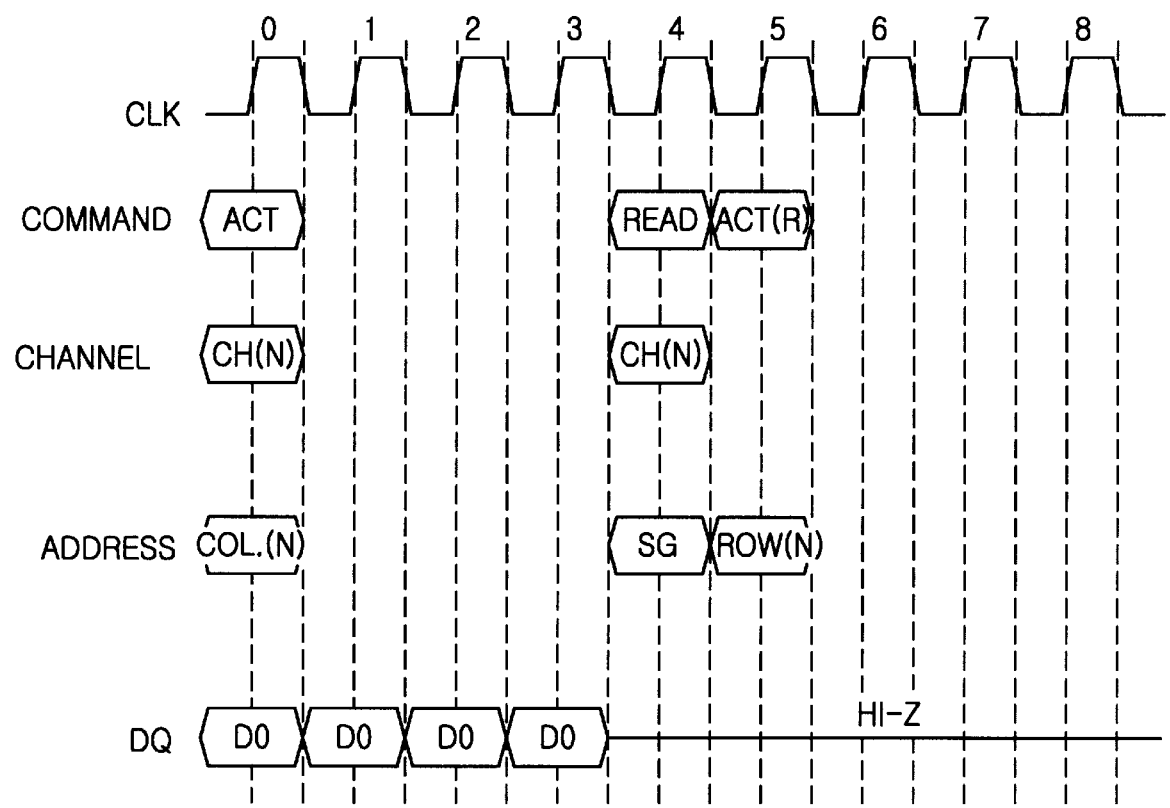
FIG. 1B shows a timing diagram for write and restore operations of the virtual channel memory in accordance with an embodiment of the present invention.

FIG. 1B shows a timing diagram for write and restore operations of the virtual channel memory in accordance with an embodiment of the present invention. WRITE is a command for a write operation to write data into a channel corresponding to column address and the channel information. RST, a command for a restore operation, activates a path to restore the data from the channel to the memory cell. ACT(R) is an active command for restoring the data in the channel to the memory cell corresponding to the row address.

Figure 2:
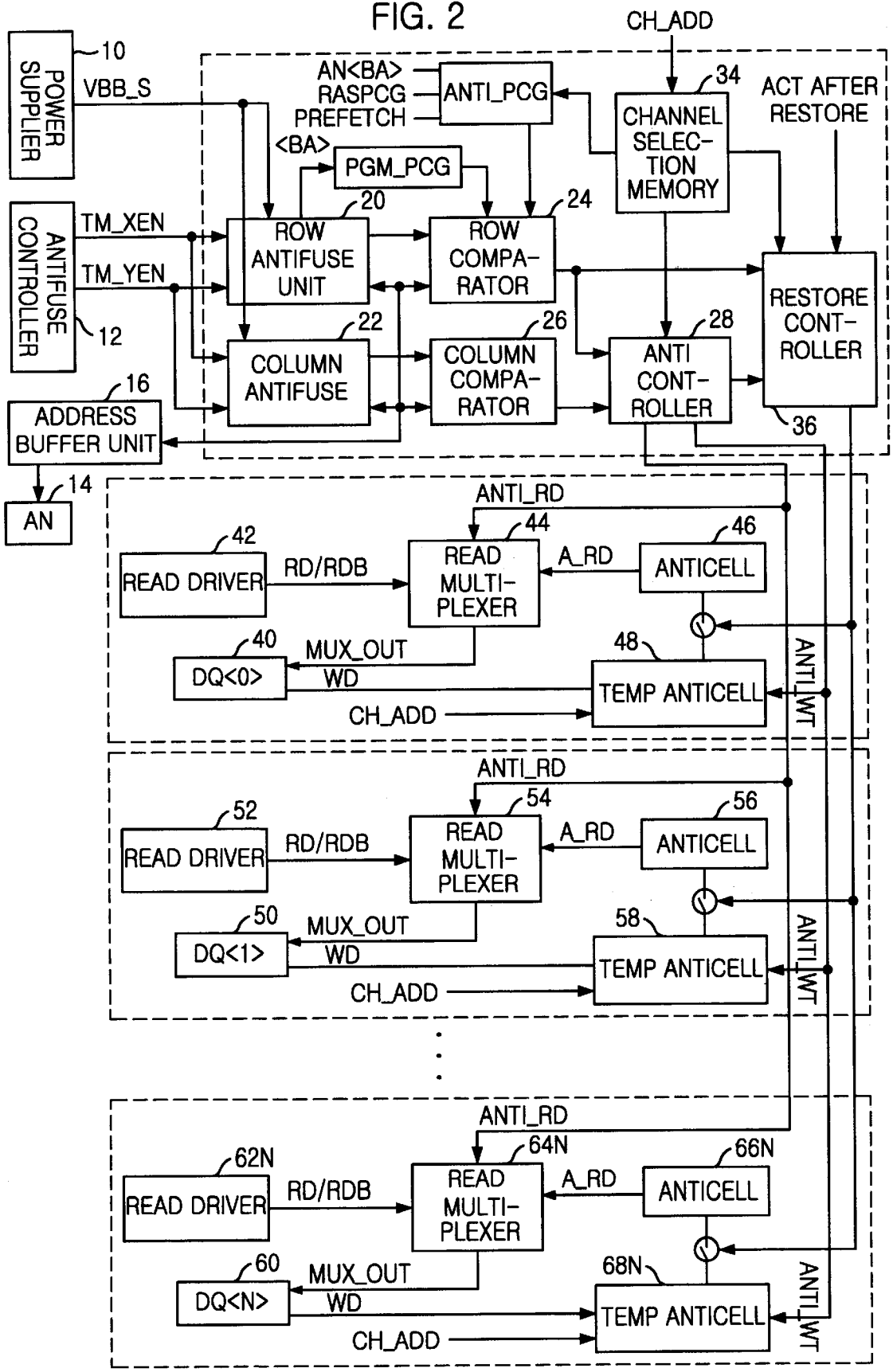
FIG. 2 is a schematic diagram illustrating a redundancy circuitry in accordance with an embodiment of the present invention.

FIG. 2 is a schematic diagram illustrating a redundancy circuitry in accordance with an embodiment of the present invention.

Referring to FIG. 2, the redundancy circuitry includes a voltage supplier 10 to supply voltage for antifuse programming typically requiring high voltage, an antifuse controller 12 for controlling programming of antifuse, a row antifuse unit 20 composed of antifuse and anti enable fuse corresponding to the row address, a column antifuse unit 22 consists of antifuse and anti enable fuse corresponding to the column address, a row comparator 24 for comparing programmed antifuse from the row antifuse unit 20 and an external row input address, a column comparator 26 for comparing programmed antifuse from the column antifuse unit 22 and an external column input address, an anti-controller 28 for controlling data input/output to/from a number of anticells 46 to 66N based on signals from the row and column comparators 24 and 26, a channel selection memory 34 for storing channel addresses which will be used for channel selection, the anticells 46 to 66N for storing data to be replaced, a number of temporary anticells 48 to 68N for temporarily storing the data to be replaced, and a restore controller 36 for, based on the row address on restore operation, transferring the data from the temporary anticells 48 to 68N corresponding to programmed fuse address to corresponding anticells 46 to 66N.

According to an embodiment of the present invention, the redundancy cells (anticells) replace the defected cells by fuse programming. The fuse programming is to pass current through it instead of breaking a metal connection through the use of high voltage, and antifuse is programmed by a row and a column addresses separately.

When a signal TM_XEN from the antifuse controller 12 is activated fuse can be programmed for each row address of the row antifuse unit 20. Similarly, when a signal TM_YEN from the antifuse controller 12 is activated the fuse can be programmed for each column address of the column antifuse unit 22. The voltage supplier 10 provides voltage high enough to program the antifuse only when the antifuse controller 12 produces an active signal.

In accordance with the present invention, a normal read operation is disclosed as follows after the fuse programming is done.

According to an active command ACT shown in FIG. 1A, each programmed fuse for all the row fuse is compared with external row address at the row comparator 24. The row comparator 24 produces inactive signal when the comparison is not matched, and the anti-controller 28 is inactivated in response to the inactive signal. By using the READ command read multiplexers 44 to 64N placed in each I/O unit provide data lines DQ 40 to 60n with data transferred from the main memory cells through each read driver 42 to 62N.

The row comparator 24 produces active signal to the anti-controller 28 when the comparison is matched. Thereafter, the data from the main memory cells is pre-fetched to the channel by the PFC command shown in FIG. 1A. The channel memory 34 keeps channel address indicating the particular channel to which the data pre-fetched.

When the read command shown in FIG. 1A is issued the anti-controller 28 compares the channel address from the channel selection memory 34 with a channel address of the column address to decide to read the pre-fetched channel. The column comparator 26 compares the external column address with each programmed fuse for all column fuses. The column comparator 26 produces inactive signal when the comparison is not matched, and the anti-controller 28 is inactivated in response to the inactive signal. The read multiplexers 44 to 64N placed in each I/O unit provide data lines DQ 40 to 60n with data transferred from the main memory cells through each read driver 42 to 62N.

The column comparator 26 produces active signal to the anti-controller 28 when the comparison is matched. The anti-controller 28 is activated according to the active signals from the row and column comparators 24 and 26. Each of the multiplexers 44 to 64N in each I/O unit is controlled by a signal ANTI_RD from the activated anti-controller 28. The data transferred from the main memory cells via each of the read drivers 42 to 62N is blocked. Instead the data stored in the anticells 46 to 66N is provided to the data lines DQ (40 to 60N).

In accordance with the present invention, a normal write operation is disclosed as follows after the fuse programming is done.

A column path is activated by a write command WRITE shown in FIG. 1B, and each programmed fuse for all column fuses is compared with an external column address at the column comparator 26. The column comparator 26 produces inactive signal when the comparison is not matched, and the anti-controller 28 is inactivated in response to the inactive signal. Thus data input through each I/O unit is written to the channel corresponding to the external column address.

The column comparator 26 produces active signal to the anti-controller 28 when the comparison is matched. Thereafter, the anti-controller 28 activates a signal ANTI_WT, and thus the external data is temporarily stored into the temporary anticells 46 to 66N in each I/O unit. The external data is also provided to a channel corresponding to an external column address. When the row addresses are not matched after ACT(R) command, the data provided to the channel is restored to the main memory cell and the data from the anticells is discarded. The channel selection memory 34 keeps the channel address.

When the channel address from the channel selection memory 34 and the temporary anticell are matched by the restore command RST shown in FIG. 1B after the external data from each I/O unit is stored to the temporary anticells, the active command ACT(R) needs to be issued for restore operation.

When a command ACT(R) shown in FIG. 1B is issued, the row fuse programmed is compared with an external row address. The restore controller 36 stores to the anticells 48 to 68N the data from the temporary anticells 48 to 68N in the I/O unit. Thereafter the data stored in the anticells is read through the I/O unit, unless there is no new pre-fetch to the channel address stored in the channel selection memory 34 or it is not write operation to the address corresponding to the row and column fuse.

After programming the antifuse, burst write operation is described as follows. A column address having the same length as the burst length is generated internally, and each programmed fuse for all column fuse, the external address and the column address internally generated are compared together at the column comparator 26. When the comparison is not matched, the anti controller 28 controls the data input through I/O unit to be written to the channel corresponding to the external column address and the column address internally generated to have the same length of the burst length.

In the case that the comparison is matched the write operation is the same as mentioned above. However, when the column addresses are identical but the row addresses are not matched, the corresponding data is stored to the temporary anticells. Thus, the number of temporary anticells needed is the same as the burst operation length.

The channel selection memory 34 keeps the channel address for the restore command RST after the burst data is stored into the temporary anticells. When an active command ACT(R) for restore is issued, the programmed row fuse for all the row fuse and external row address are compared at the comparator 24. When the comparison is matched the restore controller 36 stores to the anticells 48 to 68N the data from the temporary anticells 48 to 68N in the I/O unit according to the address form the channel selection memory 34. The operation thereafter is the same as the write operation after programming fuse described before.

While the present invention has been described with respect to certain preferred embodiments only, other modifications and variations may be made without departing from the spirit and scope of the present invention as set forth in the following claims.

What is claimed is:

1. A redundancy circuitry used in a memory device for repairing defects in a packaged memory having registers by using antifuse, comprising:

an anticell means for storing data to be replaced;

a temporary anticell means for storing said data temporarily;

a row antifuse means having an antifuse and anti enable fuse corresponding to a row address used to program the antifuse for replacing defected cells with redundant cells in the memory device;

a column antifuse means having an antifuse and anti enable fuse corresponding to a column address used to program the antifuse for replacing defected cells with redundant cells in the memory device;

an antifuse control means for controlling a programming of the antifuse in the row and column antifuse means based on said row or column address;

a voltage supplier for supplying a voltage to program said antifuse in said row and column antifuse means by said antifuse control means;

a row comparator for comparing a programmed antifuse in the row antifuse means and an external input address, thereby generating a first comparison signal;

a column comparator for comparing a programmed antifuse in the column antifuse means and an external input address, thereby generating a first comparison signal;

an anti-control means for controlling to provide external data from said anticell means on a read operation and to temporarily store the external data in said temporary anticell means on a write operation based on said first and second comparison signals from said row and column comparators;

a restore control means for, based on a row address on a restore operation, transferring the external data identical to a programmed antifuse address to said anticell means, wherein said external data is stored temporarily in said temporary anticell means by a control signal from said anti-control means and said first comparison signal from said row comparator; and a channel selection memory for storing a channel address for pre-fetch and restore operations provided during read and write operations.

2. The redundancy circuitry as recited in claim 1, wherein said row and column antifuse means each have the same number of respective row and column addresses.

3. The redundancy circuitry as recited in claim 1, wherein said row comparator compares each of the programmed antifuses with an external row address and produces an active first comparison signal when the comparison is matched and an inactive first comparison signal when the comparison is not matched, and said column comparator compares each of the programmed antifuses with an external column address and produces an active second comparison signal when the comparison is matched and an inactive second comparison signal when the comparison is not matched.

4. The redundancy circuitry as recited in claim 1, wherein said anticell means stores the external data on a write operation, and provides a stored external data on a read operation.

5. The redundancy circuitry as recited in claim 1, wherein said temporary anticell means stores said external data temporarily when the column address is matched on a write operation.

6. The redundancy circuitry as recited in claim 1, wherein the number of said anticell means is determined based on a maximum burst write length of the memory device.

* * * * *